United States Patent [19]

Green

[11] Patent Number: 5,422,924
[45] Date of Patent: Jun. 6, 1995

[54] GAIN AND OFFSET CONTROL FOR CHARGE BASED SIGNALS

[75] Inventor: Paul E. Green, La Mirada, Calif.

[73] Assignee: Rockwell International Corporation, Seal Beach, Calif.

[21] Appl. No.: 130,802

[22] Filed: Dec. 6, 1993

[51] Int. Cl.⁶ .............................................. H03K 23/46
[52] U.S. Cl. ........................................ 377/62; 377/60
[58] Field of Search ......................... 377/58, 59, 60, 63

[56] References Cited

U.S. PATENT DOCUMENTS

| | | | |
|---|---|---|---|
| 4,262,217 | 4/1981 | Levine | 377/59 |
| 4,270,060 | 5/1981 | Pines et al. | 377/58 |
| 4,574,384 | 3/1986 | Murata et al. | 377/58 |

*Primary Examiner*—John S. Heyman
*Attorney, Agent, or Firm*—H. Frederick Hamann; George A. Montanye; Philip K. Yu

[57] ABSTRACT

A device and method for controlling the gain of a charge based signal is described. The described device and method may be used for both offset correction and for gain control. First and second charge holding gates are provided for receiving a charge packet representing a signal. A control gate partitions off at least a portion of the charge on the secondary charge holding gate. The charge not so partitioned off is then transferred onto the output line as the adjusted charge packet representing the adjusted signal, where the gain is now the ratio of areas of first charge holding gate to the sum of areas of both first and second charge holding gates. The offset of a signal can also be corrected by segregating the portion of charge representing the offset of an input signal onto the second charge holding gate.

14 Claims, 6 Drawing Sheets

GAIN AND OFFSET CONTROL FOR CHARGE BASED SIGNALS

This invention was made with Government support under Contract No. DASG60-90-C-0136 awarded by the Army, The Government has certain rights in this invention.

BACKGROUND OF THE INVENTION

The present invention pertains to processing of charge-based signals, such as are output from a charge coupled device (CCD). In particular, the present invention provides gain control and/or offset correction for such charge-based signals.

The output of a charge coupled device (CCD) is a series of charge packets. A CCD converts a detected signal into a series of charge packets, each of which is a charge based representation of the detected signal's magnitude at a particular point in time. To facilitate further processing of such a charge based signal, certain adjustments to its magnitude may be necessary or desirable.

One adjustment may be to adjust the gain of the signal so that the signal's magnitude remains within the optimum performance range of the signal processing circuitry. Another adjustment may be to compensate for a constant offset in the signal.

Conventional methods of gain control use amplifiers with feedback, and require voltage or current representations of the input signal. In certain circumstances, in particular in very cold environments such as 10° Kelvin, the use of voltage or current amplifiers would produce excessive power dissipation. Current methods of offset control use amplifiers with clipping, and also require voltage or current representations of the input signals.

When the input signal is charge based, the conventional methods tend to be less desirable because conversion between charge and voltage representation of the signal may introduce excessive conversion error into the signal.

Therefore, it would be desirable to have a method of gain control and a method of offset control or correction that uses only the CCD technology charge packets.

SUMMARY OF THE INVENTION

A method and apparatus for controlling the magnitude of a charge based signal is disclosed.

The method of the invention includes allowing a charge packet representing a signal to flow onto a first charge well, and allowing a portion of that charge packet to flow from the first charge well onto a second charge well, which is partitioned off from the remaining charge on the first well. The partitioned-off portion of the charge on the second charge well is removed from the second charge well and the remaining charge on the first charge well is removed from the first well. The gain of charge packet on the first well can thus be adjusted using the ratio of areas between the first and second wells.

The apparatus of the invention includes a charge input port for receiving a charge packet representing a signal, and first and second charge output ports. The apparatus additionally includes a first charge holding gate, a second charge holding gate, and an input control gate connected to the input port and to the first charge holding gate for controlling the transfer of charge from the charge input port onto the first charge holding gate. A voltage selectable control gate connected to the first and second charge holding gates controls the transfer of charge between the first and second charge holding gates. A first output control gate connected to the first charge holding gate and the first output port controls the output of the charge from the first charge holding gate. The second charge output control gate connected to the second charge holding gate and the second output port controls the transfer of charge from the second charge holding gate.

DETAILED DESCRIPTION OF THE PREFERRED EMBODIMENTS

Figure 1:
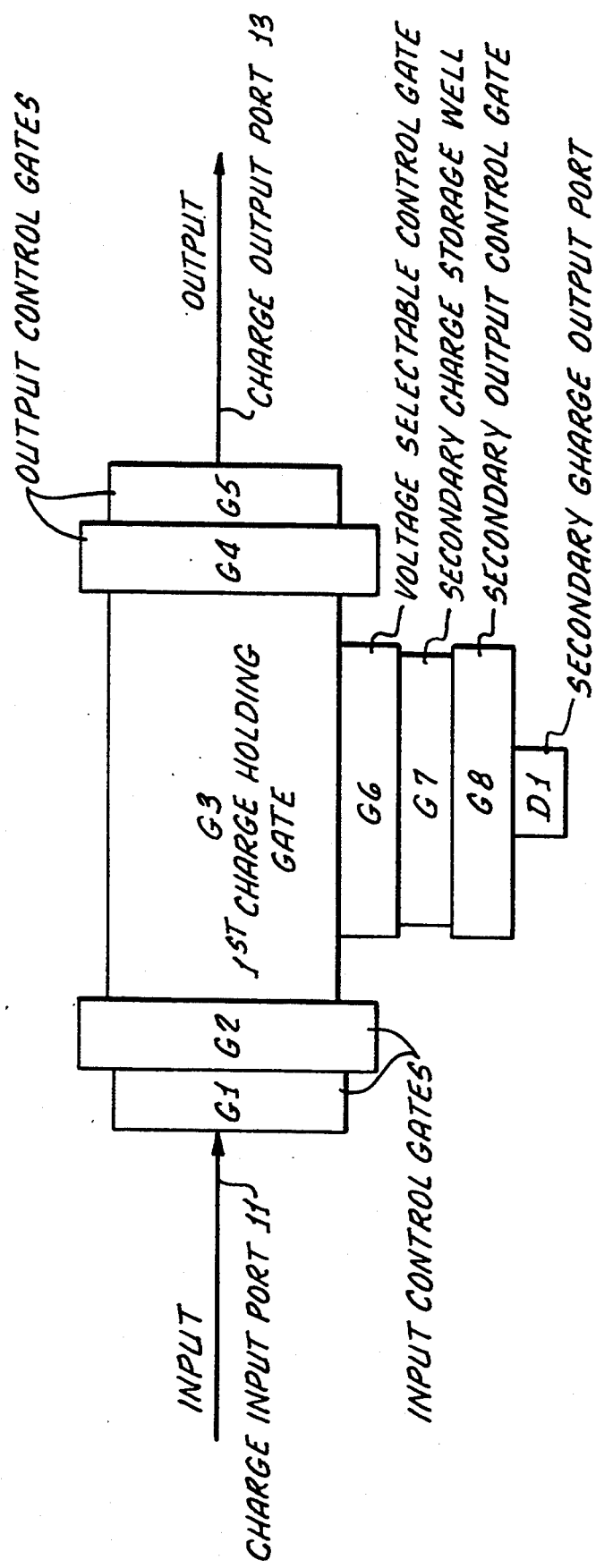
FIG. 1 is a stylized representation of a device for controlling the magnitude of a charge based signal in accordance with the invention.

A stylized representation of an embodiment of a device constructed in accordance with the present invention is illustrated in FIG. 1. As illustrated, the device includes a charge input port 11 and a charge output port 13.

A primary charge storage well or charge holding gate G3 is capable of holding a charge packet representative of a signal's magnitude at a selected point in time. A secondary charge storage well G7 is connected to the primary charge well G3 through a voltage selectable control gate G6. The charge holding capacity of each storage well is a function of the area of the storage well and the voltage applied to the well as will be appreciated by those skilled in the art. The total quantity of charge that may be held by the charge wells G3, G7 depends upon both the area of each charge well, and the voltage applied to the charge wells. Currently, the voltage on G3 and G7 is common so that the charge division is controlled by the area ratio between the wells.

First and second input control gates G1, G2 control the transfer of a charge packet on the charge input port 11 onto the primary charge well G3. Output control gates G4, G5 control the transfer of charge from the primary charge well G3 to the charge output port 13. While the input and output control gates are implemented in gates G1, G2 and G4, G5, those skilled in the art will be able to determine their structure as dictated by their specific design.

The voltage selectable control or charge transfer gate G6 controls the transfer of charge between the primary charge well G3 and the secondary charge well G7. A secondary output control gate G8 controls the transfer of charge from the secondary charge well G6 to the secondary charge output port D1.

Each of the control gates allows charge to be transferred across the control gate when the voltage applied to that control gate is lowered, and blocks the flow or transfer of charge when the voltage on the gate is raised. It should be appreciated by those skilled in the art that different material would require different polarity on the applied voltage for gate control.

Beginning with both charge wells G3, G7 empty, having no charge on them, the voltage on the output control gates G4, G5, G8 is raised to the level necessary to prevent the transfer or flow of charge across those output control gates onto the charge output ports 13 and D1. The voltage on the input control gates G1, G2 may then be lowered to permit a charge packet representing a signal to flow across those input control gates from the input port 11 onto the primary charge well G3.

Either before the charge flows onto the primary charge storage gate G3, or after, the voltage on the transfer gate G6 is lowered to permit charge to flow onto the secondary charge well G7. This distributes the charge between G3 and G7 by the area ratio of their gates.

Once the charge packet has been applied to the charge wells, the voltage on the input control gates G1, G2 is raised. This prevents additional charge from flowing into the charge well and also prevents the charge on the charge well from flowing back out onto the input port 11.

A portion of the charge on the two charge wells G3, G7 is segregated onto the secondary charge well G7 by raising the voltage on the voltage selectable control gate G6 so as to prevent the flow of that portion of the charge back from the secondary charge well G7 to the primary charge well G3.

The voltage on the primary output control gates G4, G5 may now be lowered to permit charge flow from the primary charge well G3 onto the output port 13. In addition, if the control gate G6 is not raised to such a level as to completely block the transfer of all charge between the primary and secondary charge holding gates, that portion of the charge on the secondary charge holding gate G7 that exceeds the level blocked by the transfer control gate G6 flows back through the primary charge holding gate G3, out across the output control gates G4, G5, and onto the primary signal output port 13.

In the above-described manner, the magnitude of the charge packet output onto the output port 13 is reduced by the amount of charge segregated onto the secondary charge holding gate G7 by the blocking action of the control gate G6.

The segregated portion of the charge on the secondary charge well G7 may be discarded by lowering the voltage on the secondary output control gate G8 to permit the charge on the gate G7 to flow across the control gate G8 into the secondary output port, or charge sink D1.

As will be appreciated by those skilled in the art, the invention described above may be conveniently used for both gain control to reduce the gain of a charge based signal, and for offset control to remove a constant signal offset.

Gain Control

In a preferred mode of operation for gain control, the two charge holding gates G3, G7 are maintained at the same fixed voltage to create the charge wells. Therefore, when the control gate G6 permits charge to flow between the two wells G3, G7, the ratio of the charge on those two wells is determined by the ratio of the well areas. The charge wells gates G3, G7 have their areas in the ratio of the desired gain. In other words, the desired gain equals the ratio of the area of the well G3 to the sum of the areas of both wells G3, G7.

As described in the general description above, the three output control gates G4, G5, G8 are set at a voltage sufficiently high to block the transfer of charge across them. The voltage on the input control gates G1, G2 is lower to permit the charge to flow from the charge input port 11 onto the primary charge well G3.

Figure 2A:
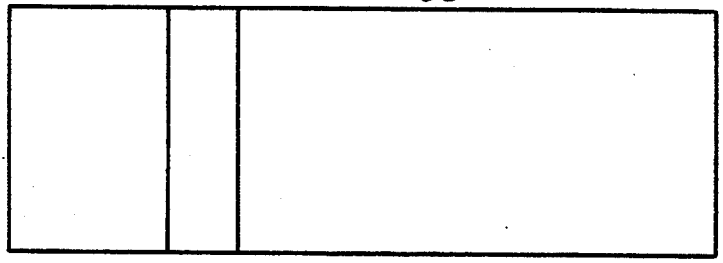
FIG. 2 is a symbolic representation of the transfer of charge between charge wells of the device of FIG. 1 in accordance with the present invention.
Figure 2B:
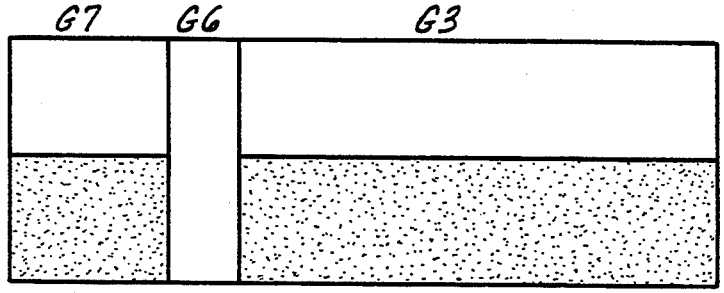

Either before or after the charge packet is applied to the charge well G3, the control gate G6 is set at a low voltage to permit the free flow of charge between the charge wells G3, G7. FIG. 2(a) conceptually illustrates the empty wells G3, G7 and the "open" control gate G6. Thus, as the charge fills the charge well G3, it also fills the secondary charge well G7. FIG. 2(b) conceptually shows the storage gates G3, G7 with the gate G6 between them lowered, so that the level of charge in each storage gate is the same. The stippling or shading represents the charge present in the wells.

Figure 2C:
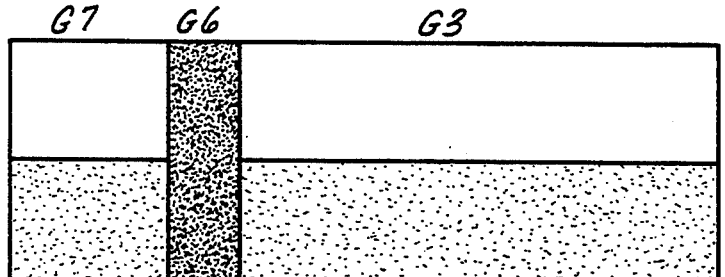

Once the entire charge packet is received by the charge wells G3, G7, the control gate G6 can be set to a blocking condition by raising the voltage applied to that control gate G6 as illustrated in FIG. 2(c).

Figure 2D:
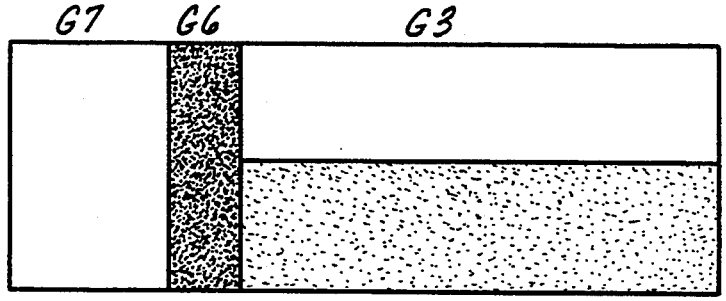

The voltage on the secondary output control gate G8 may now be lowered to permit the charge in the secondary charge well G7 to be discarded, as shown in FIG. 2(d). Because the segregation control gate G6 is kept at a blocking voltage to block any transfer of charge between the two charge wells G3, G7, none of the charge on the primary charge well G3 flows through the secondary charge well out over the secondary output control gate G8.

Consequently, the charge remaining on the primary charge well G3 is a charge packet representing the input signal appropriately gain-adjusted. The ratio of the charge remaining on the gate G3 to the received charge is the same as the ratio of the area of the gate G3 to the sum of the areas of the gates G3, G7. The voltage on the primary output control gates G4, G5 may now be lowered to permit that charge packet to be transferred across those output control gates onto the output signal line 13.

If no further processing is to be undertaken on the charge packet while it is in this magnitude control device, it is immaterial which charge storage well is emptied first. However, if further adjustment of the signal magnitude is to be undertaken here, such as offset control as described below, the charge remaining on the primary charge well G3 should not be allowed onto the output port 13.

Offset Control

The present invention may also be used for correction of signal offset. Signal offset is a constant charge that the input signal rides on. This offset may be introduced by a number of factors in the CCD components. The present invention may be used to correct or compensate for such offset, either as a singular function, or in connection with gain control as described above.

During offset correction, a charge portion representing the amount of undesired offset is segregated onto the secondary charge well G7. The transfer control gate G6 is used to form a predetermined amount of charge on the charge storage gate G7. The amount of charge blocked on the well G7 depends on a combination of the area of the well G7 and the voltage applied to the well and the reference voltage applied to control gate G6. If the area is fixed, the charge blocking capacity can still be adjusted or varied by adjusting the voltage applied to the gate forming the well.

Figure 3A:
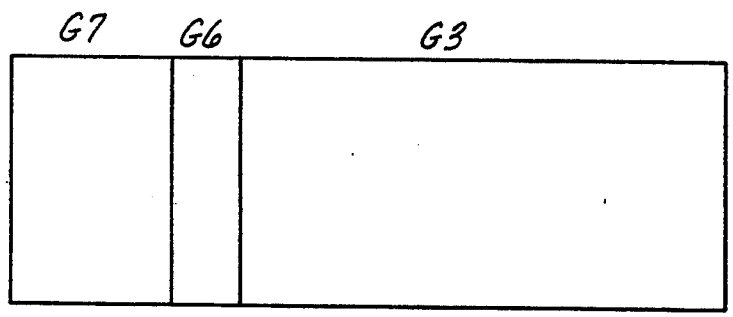
FIG. 3 is a symbolic representation of the transfer of charge between charge wells of the device of FIG. 1 in accordance with a different aspect of the present invention.

If the device is used only for offset correction, the two charge wells G3, G7 are initially empty, and the transfer gate G6 may be lowered. This is conceptually illustrated in FIG. 3(a). The output control gates G4, G5, G8 are raised to blocking voltage.

Figure 3B:
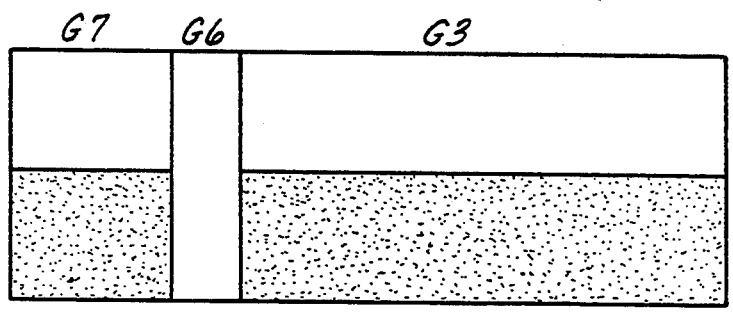

The charge packets is applied to the primary charge well G3 and, through the transfer gate G6, to the secondary charge well G7, as illustrated in FIG. 3(b).

If the charge packet is already on the primary well G3 because of a gain control operation as described above, opening the transfer gate G6 by lowering the voltage applied to it will cause the charge to flow onto the secondary well G7.

Figure 3C:
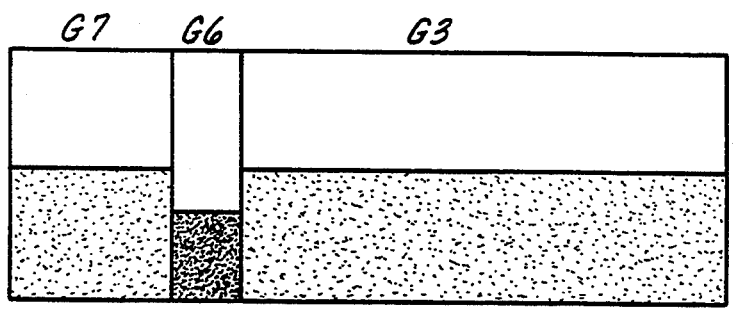
Figure 3D:
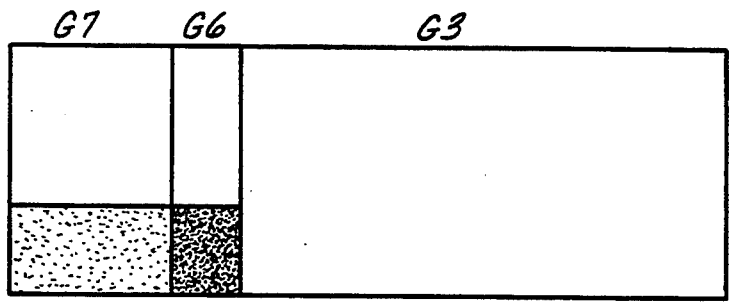

The voltage on the transfer control gate G6 is raised to the level necessary to block the appropriate amount of charge on the secondary well G7, as shown in FIG. 3(c).

Figure 4A:
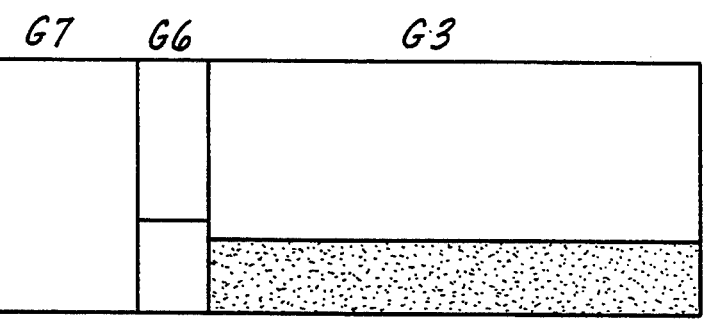
FIG. 4 is a symbolic representation of the transfer of charge in accordance with a different aspect of the present invention.

Alternatively, rather than lower the voltage on the transfer control gate G6 to completely open that gate, the voltage may be set at the level required to hold the desired amount of charge on the secondary well, as illustrated conceptually in FIG. 4(a).

Figure 4B:
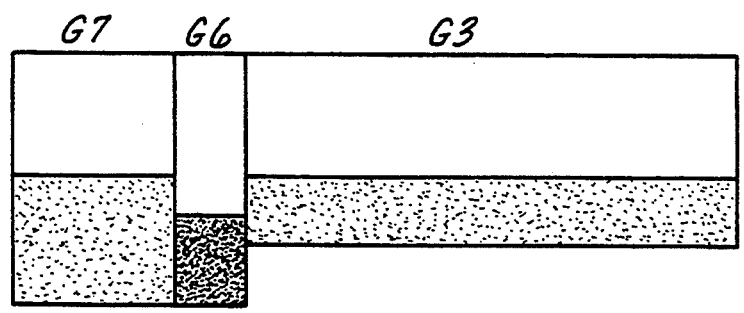
Figure 4C:
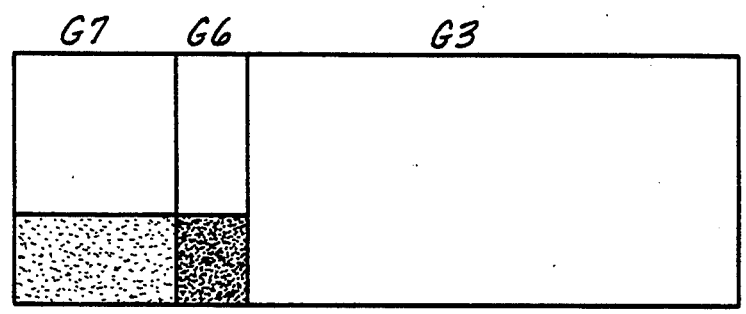

If the charge on the primary charge well G3 exceeds the effective blocking threshold of the voltage applied to the control gate G6, charge will flow across the control gate G6 onto the secondary charge well G7. To ensure that the total charge is properly distributed between the two charge wells, the voltage on the primary charge well G3 may be raised to the reference voltage, effectively raising the bottom of the charge well G3 as illustrated in FIG. 4(b). This will ensure that charge sufficient to fill the secondary charge well G7 to the level determined by the area of the secondary well and the reference voltage applied to the blocking gate G6 is filled. The voltage applied to the charge well G3 may then be lowered back to its original value.

The primary output control gates G4, G5 may then be lowered to permit the charge on the primary charge well G3 to be transferred onto the output pod 13. In addition, any charge on the secondary charge holding gate G7 that is above the reference voltage level blocked by the control gate G6 (which remains at the reference voltage) also flows back through the primary charge well G3 across the primary output control gates G4, G5. However, the undesired offset charge in the secondary charge well G7 blocked by the control gate G6 is prevented from flowing back to the primary charge well G3, and thus remains in the secondary charge well G7.

The charge so separated onto the charge well G7 may then be discarded by lowering the voltage on the secondary output control gate G8.

If the same set of gates is to be used for both gain control and offset correction without removing and reinstalling the charge, the gain control operation should be done first in time. As is apparent from the above description, the operation of the device to provide offset correction requires the transfer of charge off the primary charge well G3, which then does not permit the charge to be used for gain control.

Greater Segregation Control

Figure 5:
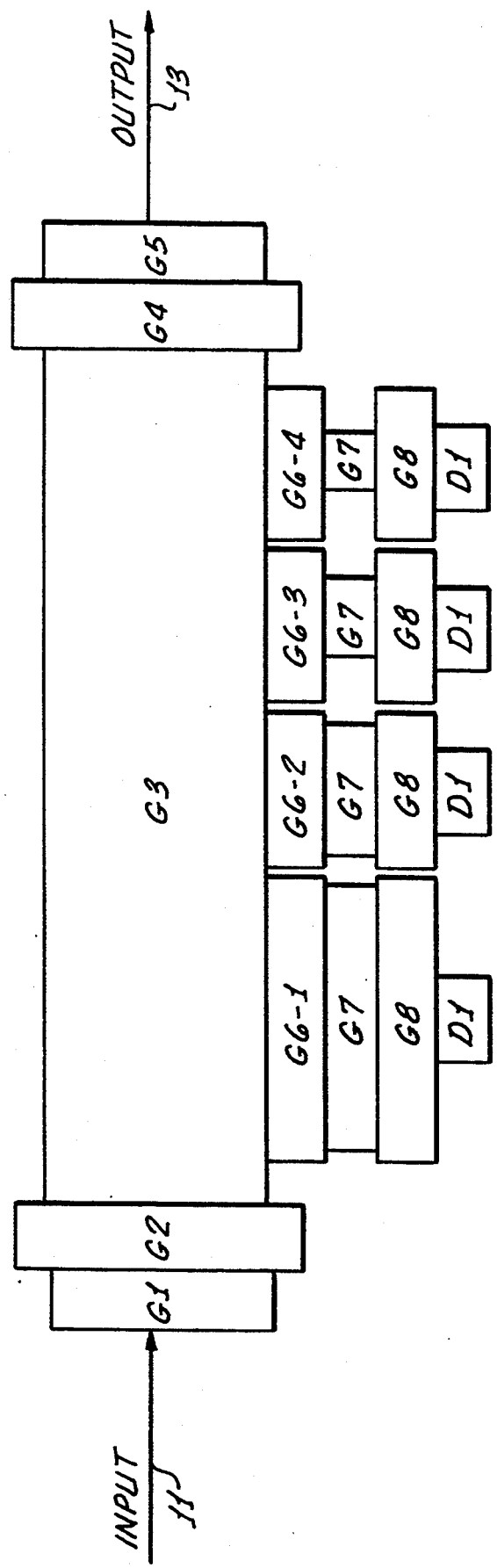
FIG. 5 is a stylized representation of an alternative embodiment of a device for controlling the magnitude of a charge based signal in accordance with the present invention.
Figure 6:
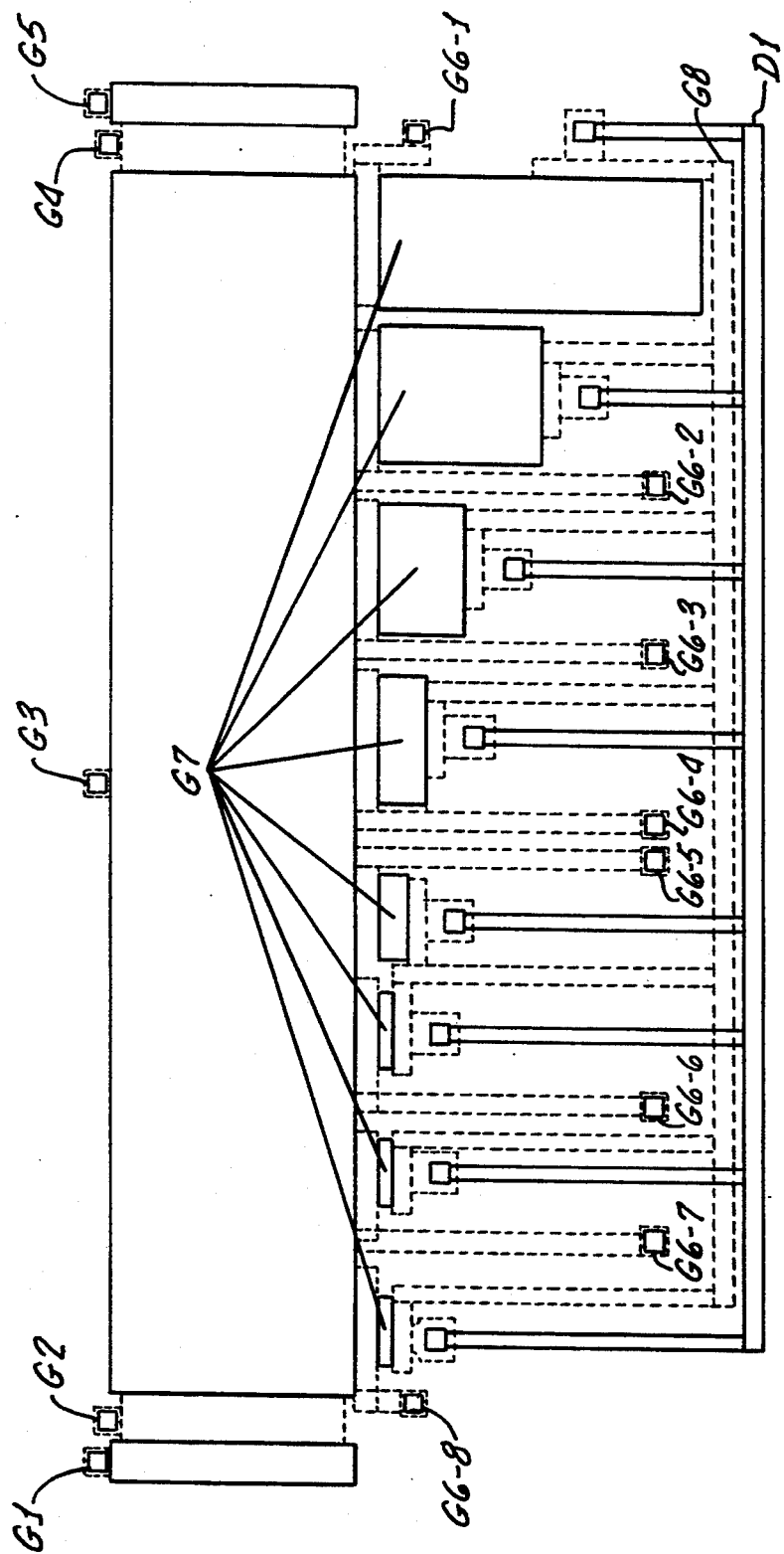
FIG. 6 is a plot of a particular embodiment of a device for controlling the magnitude of a charge based signal in accordance with the present invention.

An alternative embodiment that provides more flexibility in the magnitude of the control provided for adjustments is conceptually illustrated in FIG. 5. As illustrated, the segregation control gate G6 comprises several individually controllable control gates G6-1 through G6-4. Those skilled in the art will understand that other numbers of individual gates may be provided depending on the desired level of control.

Each of the individual control gates controls its own portion of the secondary charge well G7. The individually controllable gates G6 (and their corresponding sections of well G7) thus allows the area of the secondary well to be varied. As described above, the amount of gain adjustment and the amount of offset correction provided by the device varies and can be changed by varying the area of the charge storage well G7 controlled by the control gates G6.

In addition, if the voltage applied to the individual control gates G6-1 through G6-4 is set to be varied, even greater flexibility can be achieved for the offset control.

As illustrated, the control gates G6-1 through G6-4 (and thus their corresponding sections of the secondary charge well G7) are currently sized in a substantially binary arrangement to provide maximum flexibility of control.

When a single set of gates is used for both gain control and offset correction, the gates selected for each operation do not need to be the same. Thus, one set of individual gates may be selected to provide a particular amount of gain control, while a different set of gates may be selected to provide a different level of offset correction.

Although the invention has been described above in the context of particular embodiments, those skilled in the art will recognize that certain modifications may be made to the embodiments described without departing from the invention. Therefore, the invention is defined in the following claims.

What is claimed is:

1. An apparatus for controlling the magnitude of a charge packet representing a signal in a charge-coupled device ("COD") comprising:
   an input port for receiving a said charge packet;
   a first output port;
   a second output port;
   a first charge holding gate having a first predetermined area for holding charge;
   a second charge holding gate having a second predetermined area for holding charge;
   an input control gate connected to said input port and said first charge holding gate for controlling the transfer of charge from said input port onto said first charge holding gate;
   a voltage selectable control gate connected to said first and second charge holding gates for controlling the transfer of charge between said first and second charge holding gates to adjust the magnitude of said charge packet in said first charge holding gate by a ratio between said second predetermined area to said first predetermined area;
   an output control gate connected to said first charge holding gate and said first output port for controlling the output of the charge from said first charge holding gate onto said first output port; and a second output control gate connected to said second charge holding gate and said second output port for controlling the transfer of charge from said second charge holding gate onto said second output port.

2. The apparatus of claim 1, wherein said voltage selectable control gate is adjustable to prohibit the transfer of a predetermined amount of charge from said second charge holding gate back to said first charge holding gate.

3. The apparatus of claim 1, wherein said voltage selectable control gate comprises a plurality of individually controllable voltage selectable control gates and wherein said second charge holding gate comprises a plurality of areas of individual gates corresponding to said control gates, said plurality of areas being selectively combined by their corresponding control gates to allow the ratio between the first and second predetermined areas to vary such that a different adjustment ratio is formed.

4. The apparatus of claim 3, wherein each of said individually controllable control gates is adjustable to prohibit the transfer of a predetermined amount of charge from said second charge holding gate back to said first charge holding gate.

5. A method of controlling the gain of a charge packet representing a signal in a charge-coupled device ("CCD") comprising:
allowing said charge packet to flow onto a first charge well said first charge well having a first predetermined area for holding charge;
allowing a portion of the charge of said charge packet to flow from said first charge well onto a second charge well, said first and second charge wells have the same voltage applied to them, said second charge well having a second predetermined area for holding charge;
partitioning off said second charge well from said first charge well to prevent charge in said second charge well from flowing onto said first charge well;
removing the charge from said second charge well; and
removing the charge from said first charge well, wherein the charge from said first charge well has been gain-adjusted according to the area ratio of said first and second charge wells.

6. The method of controlling the gain of a charge based signal of claim 5, wherein:
said step of allowing a charge packet to flow onto said first charge well comprises lowering the voltage on an input control gate to permit a charge packet representing a signal to flow into said first charge well then raising the voltage on said input control gate to block the flow of charge across said input control gate from said first charge well;
said step of allowing said first charge portion to flow from said first charge well onto said second charge well comprises setting the voltage on said control gate to permit said first charge portion to flow across said control gate into said second charge well;
said step of partitioning off at least a second portion of said first charge portion onto said second charge well comprises setting the voltage on said control gate to block said second portion of said charge packet from flowing across said control gate between said first and second charge wells;
said step of removing the charge from said second charge well comprises lowering the voltage on a first output control gate onto a first output line; and
said step of removing the charge from said first charge well lowering the voltage on second output control gate connected to said first charge well to allow said charge packet to flow from said first charge well onto a second output line.

7. The method of claim 6, wherein said step of setting the voltage on said control gate to block a second portion of said charge packet from flowing across said control gate between said first and second charge wells comprises setting said voltage to block the flow of any charge across said control gate, so that said second portion of said first charge portion comprises the entirety of said first charge portion.

8. A method of gain control for a charge based signal in a charge-coupled device ("CCD") comprising:
setting the voltage on a gain correction control gate to permit charge to flow between a first charge well and a second charge well, said first charge well having a first area and said second charge well having a second area;
setting the voltage on a first output control gate to a blocking voltage to prevent charge from flowing from said first charge well onto a first output line;
setting the voltage on a second output control gate to a blocking voltage to prevent charge from flowing from said second charge well onto a second output line;
lowering the voltage on an input control gate to allow a charge packet representing a signal in said CCD to flow onto said first charge well and across said gain correction control gate onto said second charge well;
raising the voltage on said input control gate to prevent any charge of said charge packet from flowing across said first control gate;
raising the voltage on said gain correction control gate to a blocking voltage to prevent charge from flowing between said first and second charge wells such that the ratio of charge of said first to said second charge wells is substantially the same as the ratio of said first to second areas;
lowering the voltage on said second output control gate to permit the charge in said second charge well to flow onto said second output line; and
lowering the voltage on said first output control gate to permit the charge in said first charge well to flow onto said first output line, such that said charge is gain corrected according to said area ratio.

9. The method of claim 8, additionally comprising the step of holding said first and second charge wells at substantially the same voltage during said step of lowering the voltage on said input control gate to allow said charge packet to flow onto said first charge well and said second charge well.

10. The method of claim 8, wherein:
said gain correction control gate comprises a plurality of individually controlled gain correction control gates;
each of said individually controlled gain correction control gates controls the flow of charge between said first charge well and a corresponding portion of said second charge well, to selectively combine portions of said second charge well for holding charge; and said step of setting the voltage on said gain correction control gate to permit charge to flow between said first charge well and said second charge well comprises setting the voltage on predetermined ones of said gain correction control gates to permit charge to flow between said first charge well and the portions of said second charge well corresponding to said predetermined gain correction control gates.

11. The method of claim 8, additionally comprising, before said step of lowering the voltage on said first output control gate, the steps of:

again setting the voltage on said gain correction control gate to permit charge to flow from said first charge well to said second charge well; and setting the voltage on said gain correction control gate to a level to prevent a predetermined portion of the charge on said second charge well from flowing onto said first charge well, so that when the voltage on said first output control gate is lowered, the charge in said second charge well other than said predetermined portion flows onto said first output line along with said charge from said first charge well.

12. The method of claim 11, wherein:

said gain correction control gate comprises a plurality of individually controlled gain correction control gates;

each of said individually controlled gain correction control gates controls the flow of charge between said first charge well and a corresponding portion of said second charge well;

said step of setting the voltage on said gain correction control gate to permit charge to flow between said first charge well and said second charge well comprises setting the voltage on predetermined ones of said gain correction control gates to permit charge to flow between said first charge well and the portions of said second charge well corresponding to said predetermined gain correction control gates;

said step of again setting the voltage on said gain correction control gate to permit charge to flow from said first charge well to said second charge well comprises setting the voltage on predetermined ones of said gain correction control gates to permit charge to flow between said first charge well and the portions of said second charge well corresponding to said predetermined gain correction control gates; and said step of setting the voltage on said gain correction control gate to a level to prevent a predetermined portion of the charge on said second charge well from flowing onto said first charge well comprises setting the voltage on said predetermined ones of said gain correction control gates to a level to prevent a predetermined portion of the charge on each of the portions of said second charge well corresponding to said predetermined gain correction control gates from flowing onto said first charge well.

13. A method of offset control for a charge based signal in a charge-coupled device ("CCD") comprising:

setting the voltage on a first output control gate to a blocking voltage to prevent any charge from flowing from a first charge well onto a first output line;

setting the voltage on a second output control gate to a blocking voltage to prevent charge from flowing from a second charge well onto a second output line;

changing the voltage to a first level on an input control gate to allow a charge packet representing a signal in a CCD to flow onto said first charge well;

changing the voltage on said input control gate to a second level to prevent any charge of said charge packet from flowing across said first control gate;

changing the voltage to said first level on an offset correction control gate to permit charge to flow between said first charge well and said second charge well;

changing the voltage on said offset correction control gate to said second level to prevent a predetermined portion of the charge on said second charge well from flowing back onto said first charge well;

changing the voltage on said first output control gate to said first level to permit the charge in said first charge well, and the charge on said second charge well other than the predetermined portion that is prohibited by said offset correction control gate from flowing, to flow onto said first output line; and changing the voltage on a second output control gate to said first level to permit the charge in said second charge well to flow onto a second output line.

14. The method of claim 13, additionally comprising, after setting the voltage on said offset correction control gate, the steps of:

raising the voltage on the first charge well to the same voltage as said offset correction control gate; and lowering the voltage on the first charge well to its original voltage.

* * * * *